United States Patent [19]

Jessup

[11] Patent Number: 4,791,531
[45] Date of Patent: Dec. 13, 1988

[54] EXTRUDED ENCLOSURE FOR ELECTRICAL APPARATUS

[75] Inventor: James L. Jessup, Livonia, Mich.
[73] Assignee: Tech-S, Inc., Livonia, Mich.
[21] Appl. No.: 23,840
[22] Filed: Mar. 9, 1987
[51] Int. Cl.$^4$ .............................................. H05K 1/14
[52] U.S. Cl. ..................................... 361/395; 361/399
[58] Field of Search ............... 220/4 R; 361/380, 390, 361/391, 394–396, 399

[56] References Cited

U.S. PATENT DOCUMENTS

| | | | |
|---|---|---|---|
| 3,001,102 | 9/1961 | Stiefel et al. | 361/391 |
| 4,111,328 | 9/1978 | Eggert et al. | 220/4 R |
| 4,399,487 | 8/1983 | Neumann | 361/391 |
| 4,401,351 | 8/1983 | Record | 361/395 |
| 4,471,898 | 9/1984 | Parker | 361/394 |
| 4,532,513 | 7/1985 | Halvorson | 361/395 |
| 4,558,914 | 12/1985 | Prager et al. | 361/393 |
| 4,656,559 | 4/1987 | Fathi | 361/394 |

Primary Examiner—A. D. Pellinen
Assistant Examiner—Gregory D. Thompson
Attorney, Agent, or Firm—Krass & Young

[57] ABSTRACT

Disclosed is an enclosure for one or more electrical printed circuit board assemblies. The enclosure features an elongated body portion of U-shaped cross section, and is equipped with flat top and end panels. The assembled enclosure is, accordingly, a six-sided container. On the opposing inner faces of the elongated body section are formed at least one pair of cavities suitable for engaging a flat printed circuit board. The end panels are removable from the opposing ends of the elongated body section. In addition to the cavities formed on the opposing inner faces of the elongated body section for engaging the flat printed circuit board, the enclosure features an additional pair of cavities located on the opposing inner faces of the elongated body section, which lie longitudinally, parallel to the base of the elongated body portion. Each cavity is suitable for accepting a threaded fastener, such as an elongated nut and bolt. The end panels are equipped with openings to allow one end of a threaded fastener to penetrate the end panel, and engage with a corresponding threaded fastener lying within a similar set of cavities in an adjacent enclosure. By this method, a series of the described enclosures may be physically secured together.

8 Claims, 2 Drawing Sheets

EXTRUDED ENCLOSURE FOR ELECTRICAL APPARATUS

BACKGROUND OF THE INVENTION

Since the manufacture of the first electrical apparatus, the makers of such equipment have recognized the necessity for protection of the delicate internal circuitry and components of such apparatus from the physical environment of the user. Early election tubes, for example, in the first commercially available radio receivers, were routinely packaged in a sturdy oak or metal cabinet together with their associated components. As electrical technology advanced, new materials were utilized for the enclosure, but nevertheless, the exposure of the internal electrical components of any electrical apparatus to the environment has always been strictly limited. In many cases, the protection designed was both for the benefit of the electrical apparatus and for the use. The electrical apparatus was subject to breakage by impact from external objects, misuse, and damage resulting from exposure to dust, moisture and other atmospherically-born contaminants. Likewise, the internal electrical components often presented their own set of hazards to the user, among them, electric shock, radiation, high heat levels and unwanted electrical interference, in the form of radio frequency or similar electrical emissions which, if not shielded, could interfere with the operation of other electrical equipment in the same environment.

For these reasons, a variety of methods of protection of electrical circuits have been utilized. Most recently, with the advent of printed circuit boards of various compositions, it has been common to utilize extremely compact enclosures, and to take advantage of the relatively planar configuration of the printed board circuitry to allow mounting of the entire electronics carrier within the enclosure on brackets, stand-offs, screws and the like.

However, a second significant phenomenon, with the advent of large scale integration of circuits, has added a new dimension to the demands for versatile enclosures for the aforestated integrated electronic circuit carriers. Many current microprocessors and microprocessor-based controllers and their associated support circuitry utilize a "bus-oriented" circuit design. Basically, this type of design contemplates that most, if not all, power, signal, clock, data and address lines are open and unterminated in many applications, thereby allowing the interface of each bus-oriented electrical component to a theoretically infinite number of similar bus-oriented electrical components. For example, a typical eight bit microprocessor is equipped with 16 address lines and eight data lines. A serial or parallel interface integrated circuit, by way of further example, may similarly be equipped with an identical, electrically compatible set of address and data buses. In theory, a typical 16 bit address line is capable of addressing over 65,536 individual and discreet addresses. In theory then, over 65,536 individual and compatible components can be addressed by the 16 address lines, simply by electrically connecting any of the potential devices to the same bus to which the microprocessor's data and address lines are connected. This standardized approach to circuit design has resulted in a need for methods of quickly and easily connecting and disconnecting peripheral electronic devices to such data and address buses.

In typical microcomputer applications, such attachments are commonly made through the use of pin or edge card connectors located on the main circuit board. In applications where opening the microcomputer or electrical component's case for insertion and removal of peripheral devices is not practical, it is common to have an exposed electrical connector for the bus, typically in the form of a multiple conductor edge card connector or multi-pin plug and socket arrangement.

While such arrangements are often suitable for relatively fixed, nonportable installations, the interface so designed in current electrical equipment is often not particularly sturdy, and usually disparate in structure and appearance from the principal component, creating problems in physical connection, and requiring separate and independent design of each of the major components and each of its peripheral devices.

A third and significant problem with enclosures for electrical apparatus currently in use, particularly for printed circuit boards and the like, is the necessity for relatively high precision in the design and manufacture of the enclosure. Because electrical circuit boards are routinely manufactured to very close tolerances, the container in which the electrical circuit board is placed, if it is to be conservative of space, requires the same manufacturing tolerances, resulting in higher cost. Likewise, methods of mounting electrical circuit boards within such enclosures must share the same degree of tolerances, for example, mounting holes for the circuit board and the mounting hardware within the case must be precisely manufactured and aligned.

Moreover, the typical metal or plastic electrical enclosure currently manufactured is routinely manufactured to the specifications of the particular application, that is, the electrical enclosure typically embodies a mutually dependent set of variable dimensions. Enclosures are available in premanufactured sizes of, for example, six inches in length by four inches in width by one inch in depth. As the length of a premanufactured enclosure increases, typically, the manufacture of the enclosure likewise increases the width and the depth. The manufacturer of an electronic circuit board component will typically match its circuit board component size to a commercially available container, or, in the alternative, will commission the manufacture of a specific container for the manufactured component.

It can be seen, then, that a need exists for a new electrical enclosure, which eliminates the requirement for precise manufacturing tolerances in size, allows for easy installation of printed circuit board type materials, is easily variable in overall dimension at low cost, is adaptable to the attachment of supplemental or peripheral electrical components through a common bus connector, and at the same time, is sturdy, has a high degree of integrity in an assembled configuration, and is asthetically pleasing.

SUMMARY OF THE INVENTION

The invention herein disclosed, therefore, serves to meet all of the above requirements. The enclosure comprises an extruded main case component. By the use of an extruded component, the case may be easily manufactured in varying lengths, thereby being suitable for enclosure of a wide variety of electrical circuit boards. Using a single die, a long length of extruded enclosure component can be created, and the electrical case component so extruded can be cut easily to any length. Secondly, the use of uniform cross section extrusion allows the main electrical component enclosure and the electrical component enclosure for peripheral attachments to be identical in cross section, thereby insuring a precise fit between the main component and the peripherals, as well as an asthetically pleasing physical appearance. Likewise, the main and peripheral electrical enclosures can share end plates, materials for cover plates, bottom supports and the like.

The electrical enclosure also comprises, as part of the extrusion, designed-in internal cavities so disposed as to allow the easy installation of printed circuit board type carriers for electrical components. Because the extrusion is manufactured to relatively loose tolerances, variations in circuit board width can be easily accomodated by a slight spreading or slight narrowing of the two opposing sides of the extruded aluminum base. This spreading or narrowing is facilitated by establishing the thickness of the extrusion at the point where the planar, bottom portion of the extrusion joins the planar, vertical sidewalls of said extrusion, to permit some flexibility at that junction. Also manufactured as part of the extrusion are cavities for the carrying of carried through threaded fasteners in the form of elongated nuts and bolts. Again, relatively loose tolerances are maintained to allow the fasteners mobility within the cavity. The enclosure is further equipped with interchangeable and removal end plates which serve to enclose two additional sides of the container. These end plates are sometimes equipped with an opening to allow the protrusion through the said end plates of a male or female electrical connector. Likewise, the end plates are generally equipped with an opening of suitable size and shape to allow the insertion of a threaded fastener, facilitating the attachment of enclosures together.

The enclosure is also equipped with a top covering, which may or may not include means for data entry or display, or various switches for controlling the internal electrical components.

DETAILED DESCRIPTION OF THE DRAWINGS

DESCRIPTION OF THE PREFERRED EMBODIMENT

Figure 1:
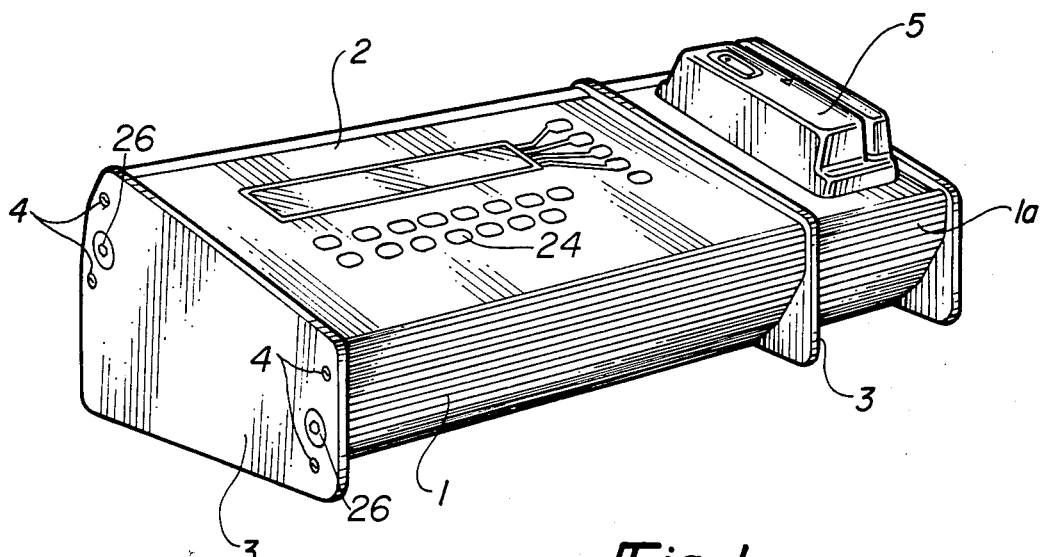
FIG. 1 is a perspective view of an assembled first enclosure and peripheral second enclosure combination.
Figure 2:
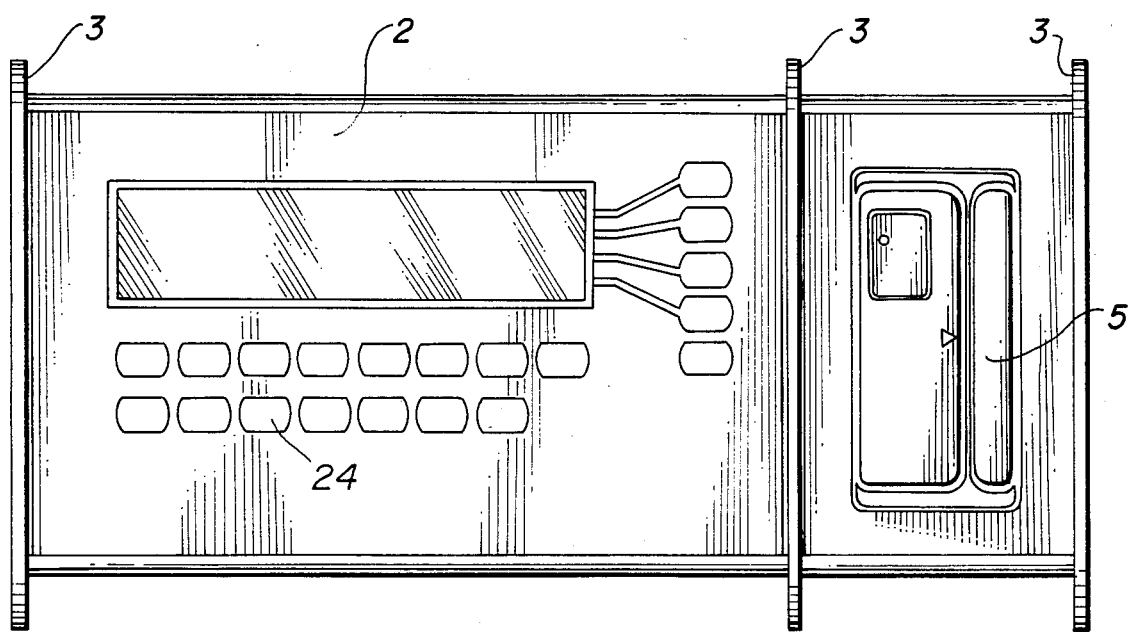
FIG. 2 is a top view of the first and second enclosures in combination showing, by way of example, a main enclosure equipped with a top panel showing the installation of a keyboard and display, and a peripheral enclosure top panel equipped with a bar code reader.

With reference now to FIGS. 1 and 2, an extruded generally U-shaped enclosure 1 component is presented, in conjunction with end panels 3 and top panel 2 or printed circuit board. In the preferred embodiment, the extruded component is of sufficient height and width so as to contain the desired electrical components, the end panels are of sufficient size so as to completely enclose the open plane of each end of the extrusion, and the top panel is of sufficient size so as to completely cover and enclose the open upper surface of the extruded component, so that, when each of the elements of the enclosure is in place, the completed enclosure comprises a six sided, more or less quarilateral cross section container.

As seen in FIG. 1, the end panels are attached to the extrusion by suitable means, for example, threaded fasteners 4, to securely hold said end panels in position. FIG. 1 also depicts a second peripheral type enclosure 1a, by way of example, the structure of which is identical to the main structure, but which may vary in lenght, but not in cross section from the main enclosure. Additionally, the peripheral enclosure may share a common end panel 3 with the main enclosure to reduce the overall length of the composite component, and to eliminate the need for one of the end panels on the main or peripheral enclosure. In the preferred embodiment, the peripheral enclosure will contain electronic components 5 which are ancillary to or supportive of the components in the main or principal enclosure.

Figure 3:
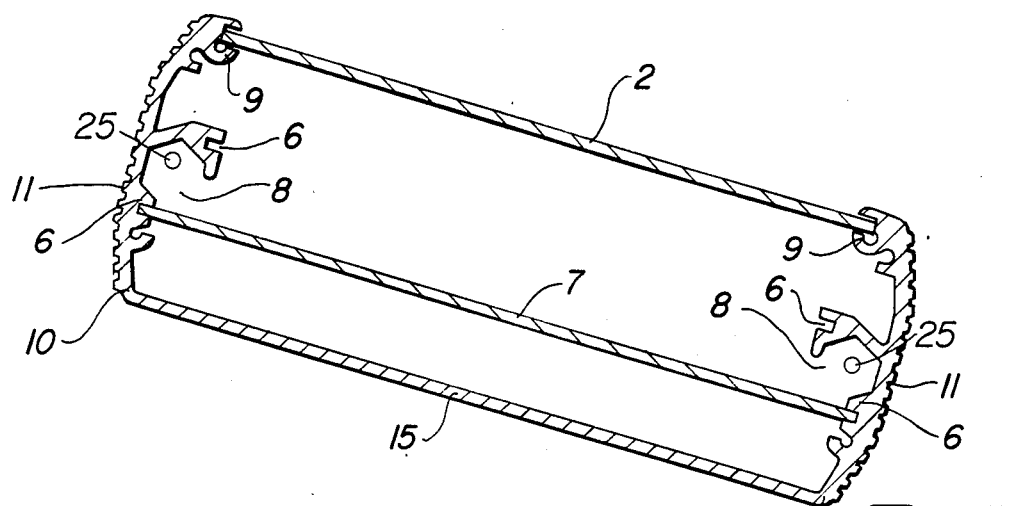
FIG. 3 is a cross sectional view of the enclosure and enclosed circuit board.

Referring now to FIG. 3, the cross section of the extrusion is presented. A planar base 15 is integrally formed as part of an extrusion also consisting of two opposing substantially vertical side members 11. The thickness of the extrusion at the point 10 in the cross section, wherein the base 15 transitions to the vertical side members 11 is selected to allow a degree of flexibility at point 10, thereby allowing for variation in the dimension measured between the opposing inner faces of the vertical members 11. In the preferred embodiment, the extrusion is manufactured with one or more pairs of opposing flanges or supports 6, suitable for securing, between their opposing faces, a printed circuit board 7 or the like, on which electrical components may be carried. Also in the preferred embodiment, an opening or cavity 8 is provided of sufficient dimension to permit the entry and pass through of an elongated fastener 25. In accordance with the preferred embodiment, as illustrated in FIG. 3, the cavities 8 are of substantially hexagonal cross section for the majority of its perimeter. Likewise, in the preferred embodiment, the extrusion is manufactured with upper slots 9, comprising a horizontal surface of suitable dimension to form a platform onto which the top panel 2 of the enclosure can be mounted. In the preferred embodiment, such slots are extruded on opposing sides of the upper ends of the extrusion, and in the same plane, thereby creating a pair of cavities in which to mount the top panel. Also in the preferred embodiment, as can be seen in FIGS. 1 and 2, the top panel 2 contains means for the input of data, such as the keyboard 24.

Figure 4:
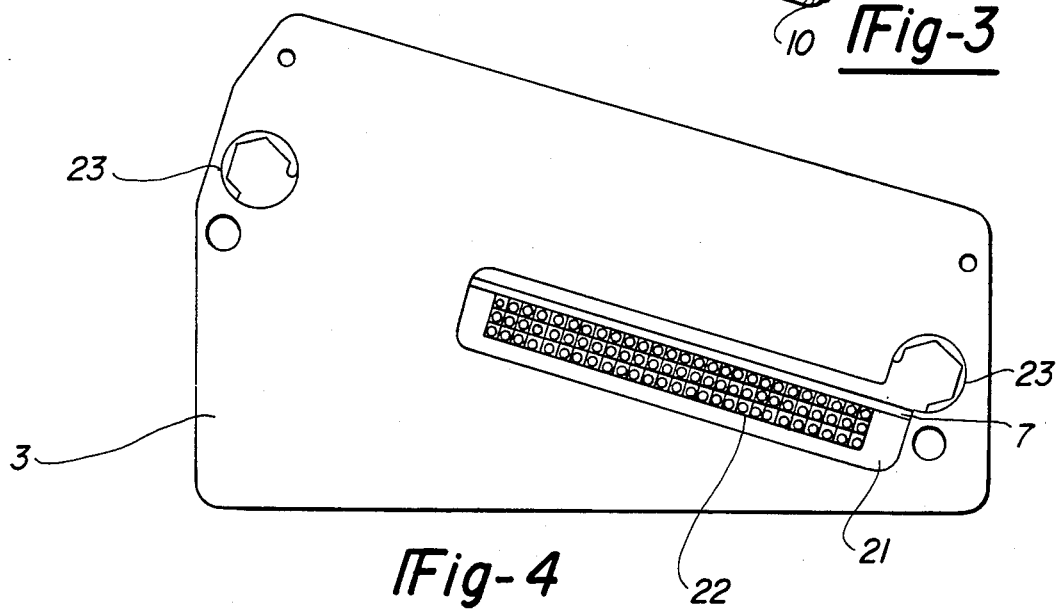
FIG. 4 is a side view of the enclosure with the end panel and electrical connector in place.

Referring now to FIG. 4, the end panel 3 is equipped with an opening 21, through which can be accessed an electrical connector 22. The end panel is likewise equipped with a pair of openings 23, through which an elongated fastener can be inserted. By this means, multiple electrical enclosures of the type herein described may be "piggybacked" or cascaded together by manufacture of a female type electrical component connector in one enclosure, a male type matching electrical connector in another enclosure, and the insertion of elongated fasteners through the mated enclosures.

In the preferred embodiment, the main enclosure is equipped with a standardized electrical connector 22 on at least one end of an internally held circuit board 7, which electrical connector is allowed to protrude through a suitable opening 21 in at least one end panel of the completed enclosure. The electrical circuit board is held in place within the electrical enclosure by the extruded flanges. The overall length of the circuit board is such as to ensure that it is in contact or close apposition with the end panels when installed, thereby preventing the electrical circuit board from longitudinal movement within the completed enclosure. The circuit board connector is allowed to protrude through an opening in at least one end panel, thereby presenting means for easy access to the electrical circuitry of the internal components. While this single and self-contained electrical component may be used and operated in this "stand alone" fashion, it is also an object of this invention to allow the attachment of one or more additional electrical enclosures to the main enclosure by like means.

In this embodiment of the invention, the second electrical enclosure in manufactured in a manner physically identical to the said first enclosure, the only variation being that the opening and electrical connector are designed to mate with the first said connector, thereby allowing an easy joining of the electrical signal lines between the internal electrical components of the two enclosures.

In the preferred embodiment as shown in FIG. 3, each enclosure is equipped with internally molded longitudinal cavities 8 for the insertion and containment of threaded fasteners 25. Typically, this cavity is hexagonal in cross section, matching the hexagonal size and shape and slightly larger than the external dimensions of a similarly shaped hexagonally elongated threaded female fastener 26. In the preferred embodiment, a threaded fastener 25 of a length slightly shorter than the overall length of the enclosure is inserted through one end panel, carrying through the internal cavity to its maximum length. Thereupon an elongated threaded female fastener 26, such as a nut, is attached to the threaded end of said threaded fastener in such manner as to protrude slightly through one end panel of the enclosure. A second threaded fastener 25 is inserted in the second opening and cavity of the first enclosure in a like fashion.

The second enclosure, attached to the first enclosure by the two mated electrical connectors, is then provided with a threaded fastener 25 of identical diameter, thread dimension and pitch, as the first threaded fastener 25, except that said second threaded fastener 25 is slightly shorter is overall length than the overall length of the second enclosure. This second threaded fastener 25 is coupled threadably to the aforedescribed female threaded fastener 26 or bolt, and is tightened, thereby creating a secure mechanical connection between the first and second enclosures. A fourth threaded fastener 25 identical to the third is inserted in a similar fashion in the second opening of the second enclosure, thereby balancing and further securing the attachment between the two enclosures.

By utilizing a threaded fastener 25 which has, for its head, a threaded female fastener 26, any number of such threaded connections may be made in line, thereby allowing any number of electrical enclosures so described to be cascaded together.

I claim:

1. An enclosure for an electrical printed circuit board assembly comprising:
   a. an elongated body portion of substantially U-shaped cross section, further comprising a substantially planar base and a pair of substantially planar vertical side members attached to and substantially perpendicular to said base;
   b. a substantially planar top panel removably engaging the upper edges of both of said pair of vertical side members opposite said base;
   c. a pair of substantially planar end panel members removably engaging the opposing open ends of the combination of said elongated body portion and said top panel;
   d. at least one pair of longitudinally-extending support means disposed on the opposing inner faces of said pair of vertical side members, said support means having a longitudinal axis substantially parallel to said base;
   e. one or more flanges integral to each of said pair of vertical side members of said elongated body portion, said one or more flanges forming with said corresponding vertical side member a longitudinally extending cavity disposed on the opposing inner face of said vertical side member, each of said cavities having a longitudinal axis substantially parallel to said base;
   f. a pair of elongated fasteners contained with said pair of cavities, removably connecting said pair of end panel members, and providing a physical connection location for other such enclosures;
   g. an electrical printed circuit board disposed within said enclosure having a first pair of opposing edges engaging said support means, and a second pair of opposing edges abutting the inner faces of said pair of end panel members;
   h. a multiple-conductor electrical connector electrically connected to said circuit board and protruding in part beyond one of said second pair of opposing edges of said circuit board;
   i. an opening formed in one end panel member of said pair of end panel members, which is located closest to said connector, permitting said connector to protrude through said end panel member; and
   j. second and third openings in each of said pair of end panel members aligned with said cavities in said elongated body portion.

2. The invention of claim 1, wherein said top panel further comprises an integral printed circuit board.

3. The invention of claim 2, wherein said printed circuit board further comprises a key pad.

4. The invention of claim 1, wherein said cavities are substantially hexagonical in cross section throughout more than one half of its perimeter.

5. The invention of claim 1, wherein each said fastener means further comprises a threaded bolt and an elongated threaded nut, wherein the length of said bolt is less than the longitudinal overall length of said cavities.

6. The invention of claim 1, wherein said top panel further comprises means for the input of data.

7. A plurality of enclosures for one or more electrical printed circuit board assemblies comprising:
   a. a first said enclosure having a first elongated body portion of substantially U-shaped cross section having a pair of first vertical side members, a substantially planar first top panel, engaging the upper edges of said pair of first vertical side members; a substantially planar first end panel member removably fastened to one end of the combination of said first elongated body portion and said first top panel, thereby leaving one end of said combination open; first support means formed on the opposing inner faces of said pair of vertical side members; at least one first printed circuit board mounted to said first support means; a pair of longitudinally extending flanges integral to the opposing inner faces of each of said first vertical side members, forming a longitudinally extending first cavity between each pair of said flanges and said corresponding first vertical side member;

b. a second enclosure having a second elongated body portion of substantially identical cross section to said first elongated body portion having a pair of second vertical side members; a substantially planar second top panel engaging the upper edges of said pair of second vertical side members; a substantially planar second end panel member removably fastened to one end of the combination of said second elongated body portion and said second top panel, thereby leaving one end of said combination open; second support means formed on the opposing pair of said second vertical side members; at least one second printed circuit board mounted to said second support means; a pair of longitudinally extending flanges integral to the opposing inner faces of each of said second vertical side members forming a longitudinally extending second cavity between each pair of said flanges and said corresponding second vertical side member;

c. a first multiple conductor electrical connector electrically connected to said first printed circit board and protruding, in part, longitudinally beyond the open end of said first elongated body portion;

d. an opening formed in said second end panel member permitting the connection of said first multiple conductor electrical connector to connect through said second end panel;

e. a pair of first elongated fasteners contained within said pair of second cavities;

f. means for connecting together each said first elongated fastener with each said second elongated fastener in said pair of cavities in said second enclosure; and g. a substantially planar last end panel member removably fastened to the open end of said elongated body portion of said second enclosure.

8. The invention of claim 1, whereby the said flanges forming said cavities are integrated with said support means.

* * * * *